(12) United States Patent
Chang et al.

(10) Patent No.: US 9,040,356 B2
(45) Date of Patent: May 26, 2015

(54) SEMICONDUCTOR INCLUDING CUP-SHAPED LEADFRAME PACKAGING TECHNIQUES

(75) Inventors: Mike Chang, Cupertino, CA (US); King Owyang, Atherton, CA (US); Yueh-Se Ho, Sunnyvale, CA (US); Mohammed Kasem, Santa Clara, CA (US); Lixiong Luo, San Jose, CA (US); Wei-Bing Chu, Shanghai (CN)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 12/487,666

(22) Filed: Jun. 19, 2009

(65) Prior Publication Data

US 2009/0256246 A1 Oct. 15, 2009

Related U.S. Application Data

(63) Continuation of application No. 11/151,749, filed on Jun. 13, 2005, now Pat. No. 7,595,547, which is a continuation of application No. 10/291,153, filed on Nov. 7, 2002, now Pat. No. 6,909,170, which is a continuation of application No. 09/468,249, filed on Dec. 10, 1999, now Pat. No. 6,744,124.

(51) Int. Cl.
*H01L 21/50* (2006.01)
*H01L 23/495* (2006.01)
*H01L 23/31* (2006.01)
*H01L 23/544* (2006.01)

(52) U.S. Cl.
CPC ....... *H01L 23/49562* (2013.01); *H01L 23/3107* (2013.01); *H01L 23/544* (2013.01); *H01L 2924/0002* (2013.01)

(58) Field of Classification Search
CPC ........... H01L 2924/01079; H01L 2924/01078; H01L 2924/01022; H01L 2924/01013
USPC ......... 257/676, 678, 728, 730, 782, 684, 687, 257/690, 666, 692, 773, 784, 786, E21.499, 257/E21.502, E23.031, E23.004, E23.043, 257/E23.047, E23.048, E23.049, E33.006; 438/123, 106, 121, 618, 666, 612, 617
See application file for complete search history.

(56) References Cited

U.S. PATENT DOCUMENTS

| | | | |
|---|---|---|---|
| 3,857,993 A | 12/1974 | Gregory | |
| 3,972,062 A * | 7/1976 | Hopp | 257/778 |
| 5,814,858 A | 9/1998 | Williams | |
| 5,920,117 A | 7/1999 | Sono et al. | |
| 5,977,630 A | 11/1999 | Woodworth et al. | |
| 5,990,500 A | 11/1999 | Okazaki | |
| 6,046,501 A | 4/2000 | Ishikawa et al. | |
| 6,075,284 A * | 6/2000 | Choi et al. | 257/676 |
| 6,081,031 A * | 6/2000 | Letterman et al. | 257/730 |

(Continued)

FOREIGN PATENT DOCUMENTS

| | | |
|---|---|---|
| JP | 406177429 | 6/1994 |
| JP | 406314822 | 11/1994 |

(Continued)

*Primary Examiner* — Hoa B Trinh

(57) ABSTRACT

A semiconductor package includes a leadframe which is cup-shaped and holds a semiconductor die. The leadframe is in electrical contact with a terminal on one side of the die, and the leads of the leadframe are bent in such a way that portions of the leads are coplanar with the other side of the die, which also contains one or more terminals. A plastic capsule is formed around the leadframe and die.

24 Claims, 2 Drawing Sheets

(56) References Cited

U.S. PATENT DOCUMENTS

| | | | |
|---|---|---|---|
| 6,133,634 A * | 10/2000 | Joshi | 257/738 |
| 6,281,579 B1 | 8/2001 | Siu | |
| 6,388,311 B1 * | 5/2002 | Nakashima et al. | 257/676 |
| 6,396,138 B1 | 5/2002 | Cheah | |
| 6,415,440 B1 | 7/2002 | Stinton | |
| 6,489,678 B1 | 12/2002 | Joshi | |
| 6,713,851 B1 | 3/2004 | Umehara et al. | |
| 6,744,119 B2 | 6/2004 | Kuo et al. | |
| 6,831,352 B1 | 12/2004 | Tsai | |
| 6,856,006 B2 | 2/2005 | Kuo | |

FOREIGN PATENT DOCUMENTS

| | | |
|---|---|---|
| JP | 406324077 | 11/1994 |
| JP | 408335720 | 12/1996 |
| JP | 409064421 | 6/1997 |
| JP | 411284117 | 10/1999 |
| WO | 00/08684 | 2/2000 |

* cited by examiner

SEMICONDUCTOR INCLUDING CUP-SHAPED LEADFRAME PACKAGING TECHNIQUES

CROSS-REFERENCE TO RELATED APPLICATIONS

This is a continuation of U.S. patent application Ser. No. 11/151,749 filed Jun. 13, 2005, which is a continuation of U.S. Pat. No. 6,909,170 issued Jun. 21, 2005, which is a continuation of U.S. Pat. No. 6,744,124 issued Jun. 1, 2004, which are all incorporated herein by reference.

BACKGROUND OF THE INVENTION

There is a continuing need for packages for semiconductor dies that are compact, easy to manufacture and economical. There is a particular need for packages that can be used to make connections to terminals on both sides of the die. For example, vertical power MOSFETs, whether of the planar or trench-gated variety, typically have source and gate terminals on the frontside of the die and a drain terminal on the backside of the die. The package must therefore provide connectibility to both sides of the die. Similarly, integrated circuits may need a ground contact to the frontside to minimize transient effects.

In addition, the package should maximize the electrical and thermal conductivity from the die to the printed circuit board on which the die is mounted.

SUMMARY OF THE INVENTION

These objectives are achieved in a semiconductor package in accordance with this invention. The package comprises a semiconductor die having first and second sides. A first electrical terminal of the die is located on the first side, and at least a second electrical terminal of the die is located on the second side. The package also includes a leadframe in electrical contact with the first terminal, the leadframe being formed in the shape of a cup. The die is located in the cup, and at least one lead of the leadframe contains a portion that is coplanar with the second side of the die. A protective plastic capsule can be formed on both sides of the cup.

When the package is mounted on, for example, a printed circuit board (PCB), the first electrical terminal is electrically connected to the PCB via the leadframe. The second electrical terminal is connected to the PCB directly using solder or another conductive material.

The package is particularly suitable for use with power MOSFETs which require a contact to the backside (drain) terminal, but it can also be used with any integrated circuit die where contact must be made to both sides of the die.

The package of this invention is easy to manufacture and can be made very thin (i.e., less than 1 mm thick).

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
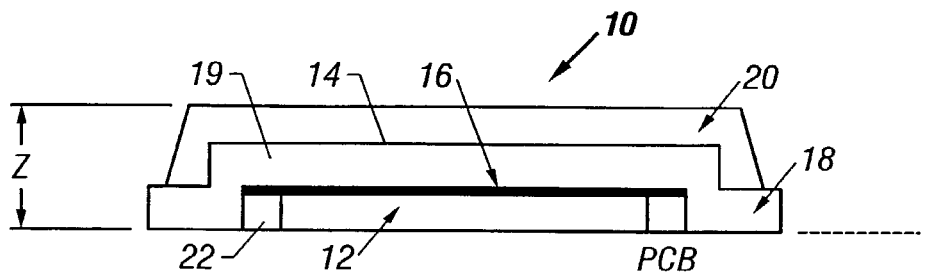
FIG. 1 shows a cross-sectional view of a semiconductor package in accordance with this invention.

FIG. 1 shows a cross-sectional view of a semiconductor package 10 in accordance with this invention. Semiconductor package 10 includes a semiconductor die 12 and a leadframe 14, which is preformed in the shape of a cup. The die 12, which in this embodiment contains a vertical MOSFET, is located inside the "cup". One side of die 12 (the backside) contains a drain terminal (not shown), which is electrically connected to leadframe 14 by means of a layer 16 of conductive epoxy or another type of conductive cement. Each of the individual leads 19 of leadframe 14 includes a portion 18 that is coplanar with the second side of the die 12. A capsule 20 made of a plastic material is in contact with the outside of the "cup", and a portion 22 of the plastic material is injected into a region inside the "cup" between the edge of die 12 and leadframe 14. The molding process used in the manufacture of package 10 ensures that the frontside of die 12 is left uncovered by the plastic material.

Figure 3:
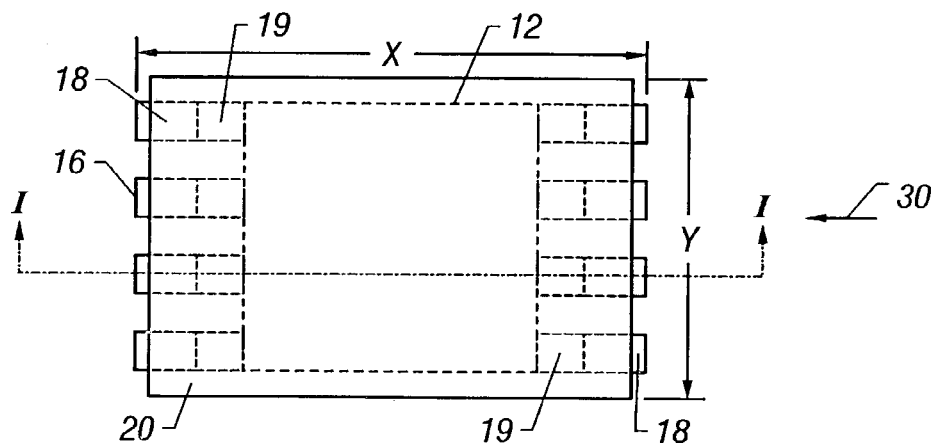
FIG. 3 shows a top view of the semiconductor package.

FIG. 1 is taken at cross-section I-I shown in FIG. 3, which is a top view of semiconductor package 10. As shown, package 10 has a length X which could be 240 mils and a width Y which could be 200 mils. Die 12 is shown in dashed lines in FIG. 3. As shown in FIG. 1, package 10 has a thickness Z that can be 0.7 mm or less.

Figure 2:
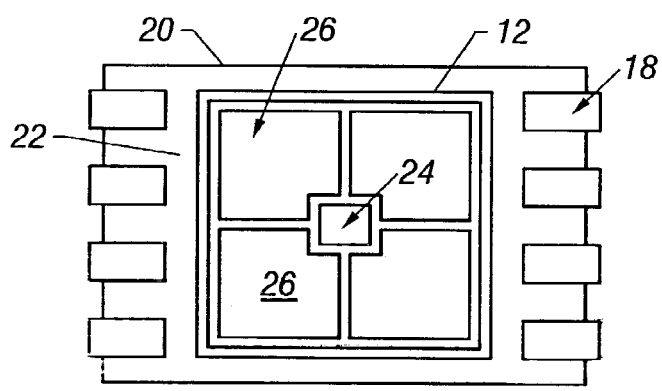
FIG. 2 shows a bottom view of the semiconductor package.

FIG. 2 shows a view of package 10 from the bottom. The bottom (frontside) of die 12 contains a gate terminal 24 and four source terminals 26 which surround gate terminal 24.

Figure 4:
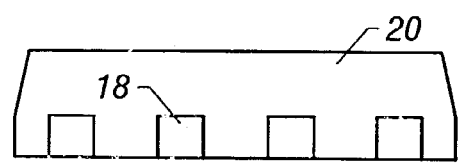
FIG. 4 shows an end view of the semiconductor package.

FIG. 4 shows a end view of semiconductor package 10, taken from direction 30 shown in FIG. 3.

Figure 5:
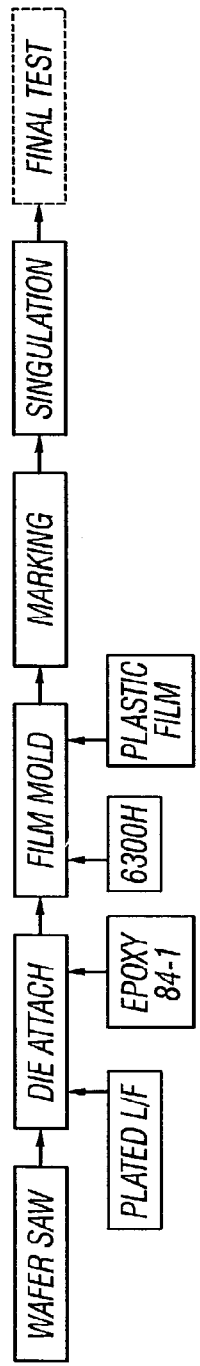
FIG. 5 is a flow chart of a process for manufacturing the semiconductor package.

FIG. 5 shows a flow chart for a process of manufacturing the semiconductor package. The process begins with the step of sawing a semiconductor wafer into individual dice. The dice are attached to leadframes (L/F) using, for example, a conductive epoxy 84-1 produced by Ablestik Electronic Materials and Adhesives. The leadframes are preformed into cup shapes as described above, with each cup having dimensions (width, length and depth) suitable to hold one of the dice. Preformed leadframes are available from many sources known to those skilled in the art.

Using a conventional injection-molding machine, plastic capsules are formed around the leadframes and dice, without touching the frontside of the die 12. Holes may be formed in the leadframe to allow the plastic material to filled the spaces between the edges of the dice and the leadframes (e.g., portion 22 in FIGS. 1 and 2). The plastic material may be the thermal set plastic 6300 H, supplied by Sumitomo of Japan.

Next, the packages are marked, and the leadframes are separated by cutting the leads (a process sometimes referred to as "singulation"). Finally, the dice can be subjected to electrical tests to ensure that they are fully operational.

Since the frontside of the die and the leads are coplanar, the package may easily be mounted on the surface of a PCB, as shown in FIG. 1.

The package of this invention is economical to manufacture and provides electrical contacts to both sides of a dice. In addition, the direct connection between the die and the PCB provides a good thermal conduction path from the die to the PCB.

Figure 6:
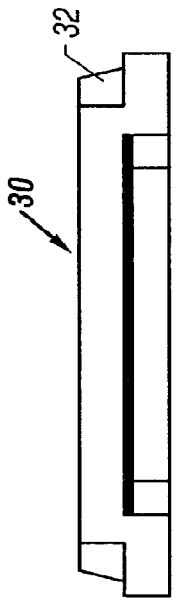
FIG. 6 is a cross-sectional view of an alternative embodiment of the invention.

Alternatively, the package can be formed as shown in the cross-sectional view of FIG. 6. In package 30 the capsule 32 is truncated, leaving the top of the leadframe is exposed. This embodiment may further improve the thermal dissipation properties of the package.

Figure 7:
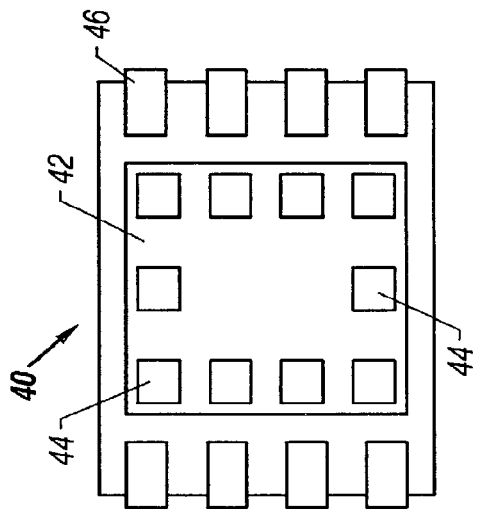
FIG. 7 is a bottom view of a package for an integrated circuit die in accordance with this invention.

While this invention was described with reference to a vertical MOSFET, this description is to be considered illustrative and not limiting. The broad principles of this invention are applicable to any semiconductor die which is to be packaged in such a way that contact is made to both sides of the die, including integrated circuit (IC) dice that require a contact to the frontside. For example, FIG. 7 shows a bottom view of an package 40 which includes an IC die 42. Ten input/output (I/O) pads 44 are located on the frontside of IC die 42. FIG. 7 is similar to FIG. 2, with a cup-shaped leadframe being electrically connected to the backside of die 42 (typically ground) and having leads with portions 46 (similar to portions 18) that are coplanar with the frontside of die 42.

Persons skilled in the art will appreciate that numerous other embodiments may be fabricated in accordance with the broad principles of this invention.

What is claimed is:

1. A method of fabricating a semiconductor package comprising electrically coupling a first side of a die to a first portion of a cup shaped lead frame such that a surface of a second portion of the cup shaped lead frame along two edges of the die is coplanar with a second side of the die but not electrically coupled to a terminal of the second side of the die and the second portion of the cup shaper lead frame along the other two edges of the die is not coplanar with a second side of the die, wherein the first side of the die is oppositely disposed from the second side of the die, and wherein the second portion of the cup shaped lead frame includes a plurality of individual leads along each of the two edges of the die.

2. The method according to claim 1, wherein the first side of the die and the first portion of the cup shaped lead frame are electrically coupled by depositing a conductive epoxy or cement between the first side of the die and the first portion of the cup shaped lead frame.

3. The method according to claim 1, further comprising encapsulating the cup shaped lead frame and die such that the terminal on the second side of the die and the second portion of the cup shaped lead frame are exposed.

4. The method according to claim 3, wherein the encapsulant covers the first portion of the cup shaped lead frame.

5. The method according to claim 3, wherein the encapsulant does not cover the first portion of the cup shaped lead frame.

6. The method according to claim 3, wherein the encapsulant is injected between the die and a third portion of the cup shaped lead frame coupling the first and second portion of the cup shaped lead frame, and wherein holes between each of the plurality of individual leads in the second portion allow the encapsulant to fill a space between the third portion of the cupped lead frame and the die.

7. The method according to claim 3, wherein encapsulating the cup shaped lead frame and the die comprises injection molding plastic.

8. The method according to claim 1, further comprising forming the cup shaped lead frame wherein a third portion couples the first portion to the second portion to form a cup to hold the die.

9. The method according to claim 8, further comprising forming the cup shaped lead frame wherein the second portion includes the plurality of individual leads.

10. The method according to claim 1, wherein the second side of the die includes one or more additional terminals.

11. A method of fabricating a semiconductor package comprising attaching a first surface of a semiconductor die to a first portion of a lead frame using a conductive epoxy wherein the lead frame is cupped to define a recess sized to accommodate the semiconductor die and wherein a second portion of the cup shaped lead frame includes a plurality of individual leads along each of two edges of the semiconductor die and each individual lead having a mounting surface coplanar with the second surface of the semiconductor die but not electrically coupled to the second surface of the semiconductor die.

12. The method according to claim 11, further comprising encapsulating the lead frame and the semiconductor die, wherein the second portion of the lead frame and the second surface of the semiconductor die are exposed.

13. The method according to claim 11, further comprising forming the lead frame wherein the first portion of the lead frame is adapted to attached to the first surface of the semiconductor die and wherein the second portion of the lead frame is adapted to he coplanar with the second surface of the semiconductor die.

14. The method according to claim 11, further comprising electrically coupling the second portion of the lead frame and the second surface of the semiconductor die to a printed circuit board.

15. A semiconductor package comprising:
a die including a first side and a terminal on a second side, wherein the second side is oppositely disposed from the first side; and
a cupped lead frame including a first portion electrically coupled to the first side of the die, a surface of each of a plurality of individual leads of a second portion of the cupped lead frame along each of two edges of the die disposed coplanar to a surface of the second side of the die but electrically isolated from the terminal on the second side of the die, and a third portion extending between the first and second portion.

16. The semiconductor package of claim 15, wherein the first portion of the cupped lead frame is electrically coupled to the first side of the die by a conductive epoxy.

17. The semiconductor package of claim 15, further comprising an encapsulant mechanically coupling the die and the cupped lead frame.

18. The semiconductor package of claim 17, wherein the encapsulant is disposed between the third portion of the cupped lead frame and the die.

19. The semiconductor package of claim 18, wherein the encapsulant is further disposed over the first portion of the cupped lead frame.

20. The semiconductor package of claim 15, wherein the cupped lead frame thermally couples the first side of the die to a printed circuit board.

21. The semiconductor package of claim 15, wherein the cupped lead frame and the terminal on the second side of the die electrically couple the die to a printed circuit board.

22. The semiconductor package of claim 21, wherein the cupped lead frame and the terminal on the second side of the die mechanically couple the die to the printed circuit board.

23. The semiconductor package of claim 15, further comprising one or more additional terminals on the second side of the die.

24. The semiconductor package of claim 17, wherein holes between each of the plurality of leads in the second portion allow the encapsulant to fill a space between the third portion of the cupped lead frame and the die.

* * * * *